United States Patent
Song (10) Patent No.: US 8,344,752 B2
(45) Date of Patent: Jan. 1, 2013

(54) SEMICONDUCTOR INTEGRATED CIRCUIT

(75) Inventor: Seong Hwi Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 33 days.

(21) Appl. No.: 12/983,081

(22) Filed: Dec. 31, 2010

(65) Prior Publication Data

US 2011/0291700 A1 Dec. 1, 2011

(30) Foreign Application Priority Data

May 31, 2010 (KR) .................. 10-2010-0051366

(51) Int. Cl.
*H03K 17/16* (2006.01)

(52) U.S. Cl. ......................................... 326/30

(58) Field of Classification Search ............ 326/30, 326/82–87
See application file for complete search history.

(56) References Cited

U.S. PATENT DOCUMENTS

| 7,148,721 | B2 | 12/2006 | Park | |
|---|---|---|---|---|
| 7,420,386 | B2 * | 9/2008 | Wang et al. | 326/30 |
| 7,443,193 | B1 * | 10/2008 | Santurkar et al. | 326/30 |
| 7,825,682 | B1 * | 11/2010 | Wang et al. | 326/30 |
| 7,999,568 | B1 * | 8/2011 | Santurkar et al. | 326/30 |
| 2003/0218914 | A1 | 11/2003 | Kim et al. | |
| 2007/0236247 | A1 * | 10/2007 | Wang et al. | 326/30 |
| 2009/0278565 | A1 * | 11/2009 | Nguyen et al. | 326/30 |
| 2010/0308861 | A1 * | 12/2010 | Lee | 326/30 |
| 2011/0267911 | A1 * | 11/2011 | Jung | 365/201 |

FOREIGN PATENT DOCUMENTS

| JP | 1999-186896 | 7/1999 |
|---|---|---|
| JP | 2008-017376 | 1/2008 |
| KR | 1020070063825 A | 6/2007 |
| KR | 1020080114086 A | 12/2008 |

* cited by examiner

*Primary Examiner* — Thienvu Tran (74) *Attorney, Agent, or Firm* — William Park & Associates Ltd.

(57) ABSTRACT

A semiconductor integrated circuit includes an impedance control signal generation block configured to transmit first impedance control signals and second impedance control signals through same signal lines at predetermined time intervals, and input/output blocks configured to separately receive the first impedance control signals and the second impedance control signals at corresponding time intervals and perform a data input/output operation based on set impedance.

7 Claims, 7 Drawing Sheets

SEMICONDUCTOR INTEGRATED CIRCUIT

CROSS-REFERENCES TO RELATED APPLICATION

The present application claims priority under 35 U.S.C. §119(a) to Korean application number 10-2010-0051366, filed on May 31, 2010, in the Korean Intellectual Property Office, which is incorporated herein by reference in its entirety.

BACKGROUND

1. Technical Field

The present invention relates to a semiconductor integrated circuit.

2. Related Art

In circuits performing signal transmission and reception, a process of matching the impedance of the circuits is necessary in order to improve the interface characteristics thereof.

For example, a semiconductor memory such as a DDR3, which is one example of a semiconductor integrated circuit, also performs an impedance calibration operation in order to improve the interface characteristics of circuits, and the impedance calibration operation is defined in the specification thereof.

To this end, the semiconductor memory includes an impedance calibration circuit for performing the impedance calibration operation.

Figure 1:
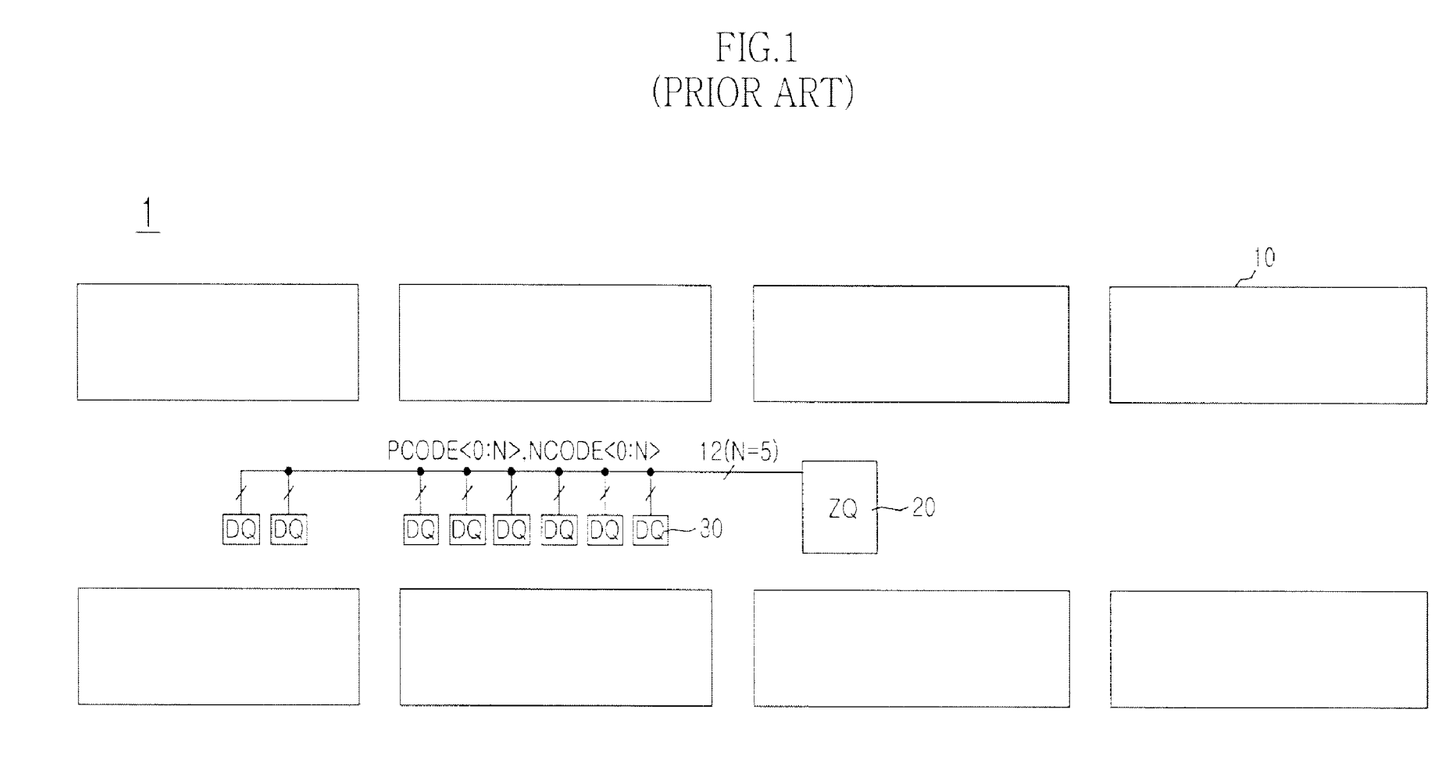
FIG. 1 is a layout view of a semiconductor integrated circuit including an impedance calibration circuit according to the conventional art.

Referring to FIG. 1, there is shown a semiconductor integrated circuit according to the conventional art, that is, a memory chip 1 includes an impedance calibration circuit and a plurality of memory blocks 10. The impedance calibration circuit includes an impedance control signal generation block ZQ (20) and a plurality of input/output blocks DQ (30).

As illustrated in FIG. 1, the impedance control signal generation block 20 and the plurality of input/output blocks 30 are located in the peripheral area of the memory chip 1.

The impedance control signal generation block 20 is disposed at a specific position of the memory chip 1 and the plurality of input/output blocks 30 are arranged in a row.

The impedance control signal generation block 20 calibrates the values of impedance control signals PCODE<0:N> and NCODE<0:N> through a process of comparing an external resistor with a resistor according to the impedance control signals PCODE<0:N> and NCODE<0:N> in response to an impedance calibration command.

When the resistance value of the external resistor substantially coincides with the resistance value of the resistor according to the impedance control signals PCODE<0:N> and NCODE<0:N>, the impedance control signal generation block 20 substantially maintains the values of the impedance control signals PCODE<0:N> and NCODE<0:N>.

The impedance of the plurality of input/output blocks 30 is set to a target value according to the impedance control signals PCODE<0:N> and NCODE<0:N> provided by the impedance control signal generation block 20.

The impedance control signals PCODE<0: N> and NCODE<0:N> are provided to the plurality of input/output blocks 30 through signal lines, that is, global lines.

When the 'N' is 5, since the number of the impedance control signals PCODE<0:N> and NCODE<0:N> is 12, 12 global lines are necessary.

The impedance calibration circuit according to the conventional art is located in the peripheral area of the memory chip 1.

In order to reduce the size of a memory chip, it is necessary to reduce the size of a peripheral area. To this end, it is important to reduce the size of a circuit located in the peripheral area, and it is also important to reduce the number of global lines for signal transfer among circuits.

However, according to the conventional art, since global lines for transmitting the impedance control signals PCODE<0:N> and NCODE<0:N> are necessarily provided as illustrated in FIG. 1, it is difficult to reduce the chip size.

SUMMARY

A semiconductor integrated circuit with a reduced number of global lines is described herein.

In one embodiment of the present invention, a semiconductor integrated circuit includes: an impedance control signal generation block configured to transmit first impedance control signals and second impedance control signals through same signal lines at predetermined time intervals; and input/output blocks configured to set impedance using the transmitted first impedance control signals and the second impedance control signals.***

In another embodiment of the present invention, a semiconductor integrated circuit includes: an impedance control signal generation block configured to transmit multiplexed signals, which are generated by multiplexing first impedance control signals and second impedance control signals according to time, through same signal lines; and input/output blocks configured to set impedance by demultiplexing the multiplexed signals according to time.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to an embodiment of the present invention will be described in more detail with reference to the accompanying drawings through exemplary embodiments.

Figure 2:
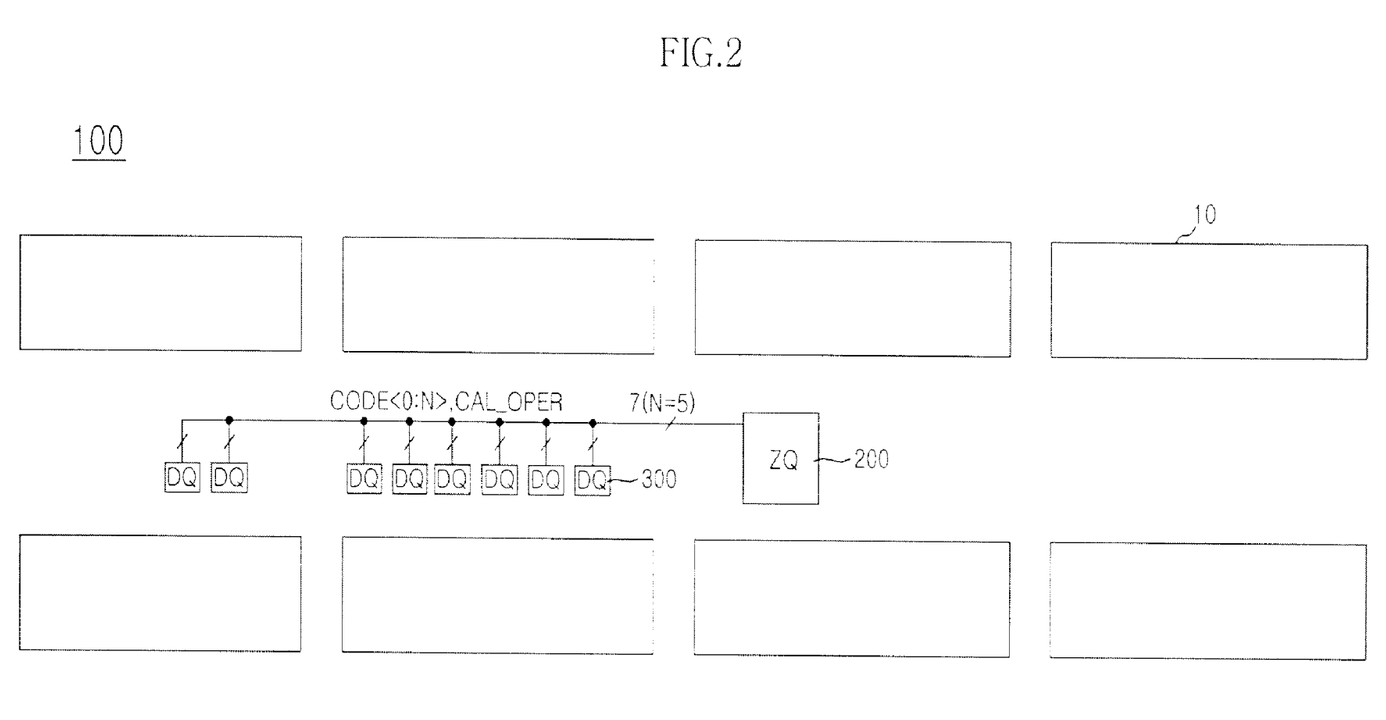
FIG. 2 is a layout view of a semiconductor integrated circuit including an impedance calibration circuit according to an embodiment of the present invention.

As illustrated in FIG. 2, the semiconductor integrated circuit according to the embodiment of the invention, that is, a memory chip 100, includes an impedance calibration circuit and a plurality of memory blocks 10. The impedance calibration circuit includes an impedance control signal generation block ZQ (200) and a plurality of input/output blocks DQ (300) connected to the impedance control signal generation block 200 through global lines.

The impedance control signal generation block 200 and the plurality of input/output blocks 300 are located in the peripheral area of the memory chip 100.

According to the embodiment of the invention, the impedance control signal generation block 200 is configured to multiplex and transmit first and second impedance control signals PCODE<0:N> and NCODE<0:N> according to time, and the plurality of input/output blocks 300 is configured to receive and demultiplex the multiplexed first and second impedance control signals PCODE<0:N> and NCODE<0:N> according to corresponding time.

Consequently, according to the embodiment of the invention, it is possible to reduce the number of signal lines (i.e., global lines) connected between the impedance control signal generation block 200 and the plurality of input/output blocks 300 to about half of the number of global lines according to the conventional art.

For example, when the 'N' is 5, according to the conventional art, it is necessary to provide 12 global lines because a total 12 bits are present in the first and second impedance control signals PCODE<0:N> and NCODE<0:N>.

However, according to the embodiment of the invention, 7 global lines are provided because only 7 bits are needed. The first and second impedance control signals PCODE<0:N> and NCODE<0:N> are multiplexed on 6 bits of impedance control signals CODE<0:N>, and an impedance calibration signal CAL_OPER of 1 bit is needed.

The impedance control signal generation block 200 is configured to transmit the first impedance control signals PCODE<0:N> and the second impedance control signals NCODE<0:N>, which are generated in response to an impedance calibration command ZQC, through the global lines at predetermined time intervals.

The plurality of input/output blocks 300 are configured to separately receive the first impedance control signals PCODE<0:N> and the second impedance control signals NCODE<0:N>, which are transmitted at the predetermined time intervals, at corresponding time intervals.

The impedance of the plurality of input/output blocks 300 is set according to the first impedance control signals PCODE<0:N> and the second impedance control signals NCODE<0:N>.

Figure 3:
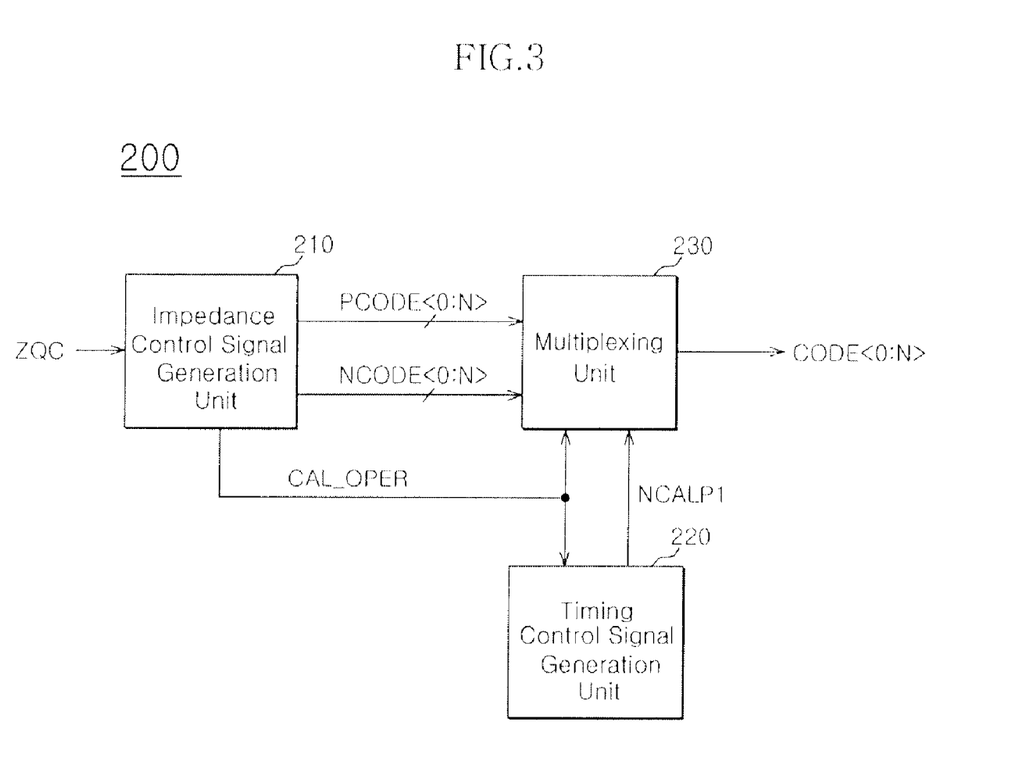
FIG. 3 is a block diagram illustrating the internal configuration of the impedance control signal generation block illustrated in FIG. 2.

As illustrated in FIG. 3, the impedance control signal generation block 200 includes an impedance control signal generation unit 210, a timing control signal generation unit 220, and a multiplexing unit 230.

The impedance control signal generation unit 210 is configured to generate the impedance calibration signal CAL_OPER for setting a calibration period in response to the impedance calibration command ZQC, and generate the first impedance control signals PCODE<0:N> and the second impedance control signals NCODE<0:N> by performing a calibration operation according to the impedance calibration signal CAL_OPER.

The timing control signal generation unit 220 is configured to generate a timing control signal NCALP1 in response to the impedance calibration signal CAL_OPER.

The timing control signal generation unit 220 generates the timing control signal NCALP1 maintaining an active state for a predetermined time from the active end time of the impedance calibration signal CAL_OPER.

The multiplexing unit 230 is configured to generate multiplexed signals CODE<0:N> by multiplexing the first impedance control signals PCODE<0:N> and the second impedance control signals NCODE<0:N> according to control signals, that is, the impedance calibration signal CAL_OPER and the timing control signal NCALP1.

Figure 4:
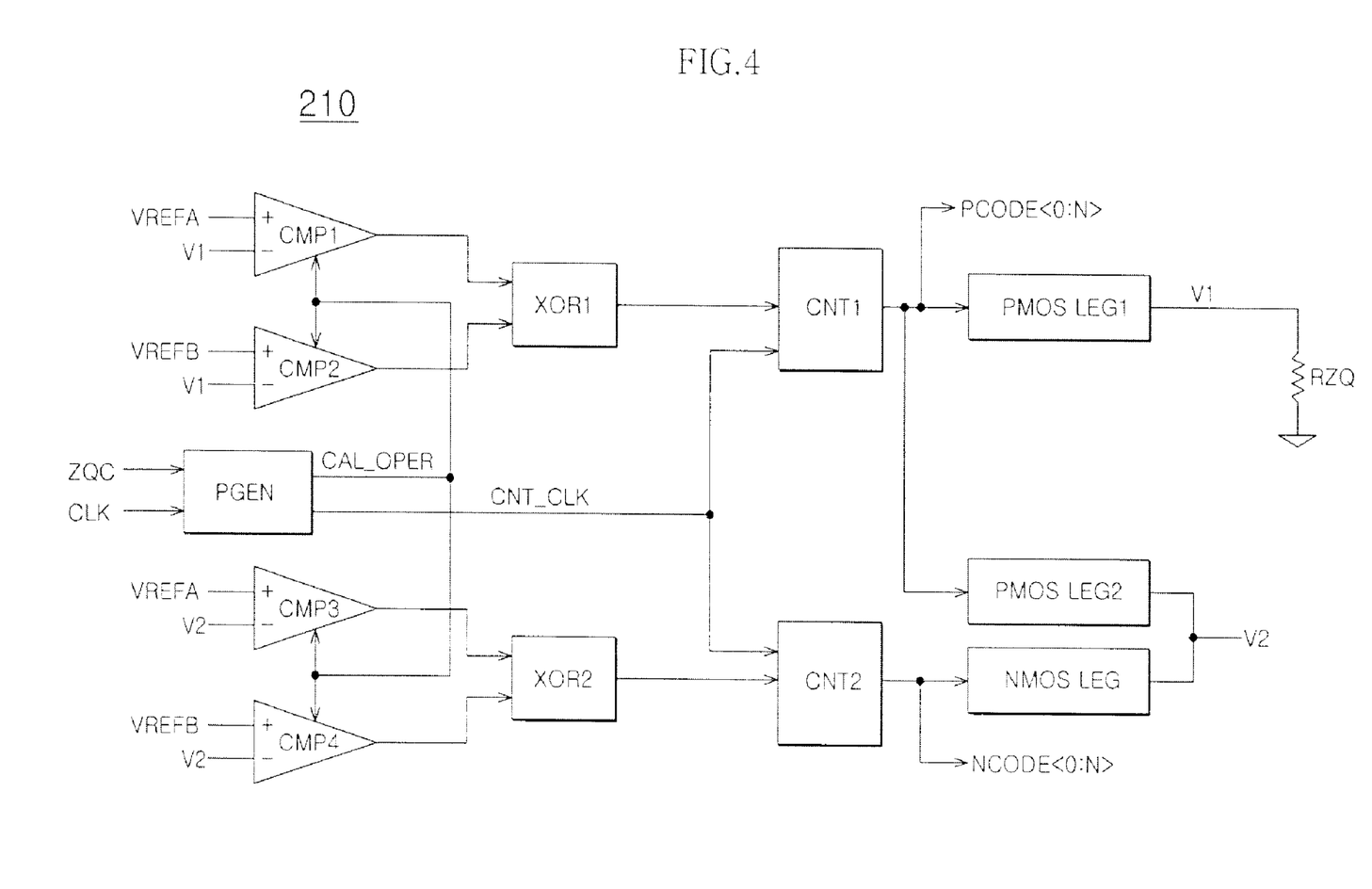
FIG. 4 is a block diagram illustrating the internal configuration of the impedance control signal generation unit illustrated in FIG. 3.

As illustrated in FIG. 4, the impedance control signal generation unit 210 of FIG. 3 includes a pulse generator PGEN, a plurality of comparators CMP1 to CMP4, a plurality of logic circuits XOR1 and XOR2, a plurality of counters CNT1 and CNT2, a plurality of PMOS legs PMOS LEG1 and PMOS LEG2, and an NMOS leg NMOS LEG.

The PMOS leg PMOS LEG1 is connected to a resistor RZQ outside the memory chip 100 through a pad.

The pulse generator PGEN receives the impedance calibration command ZQC and a clock signal CLK to generate the impedance calibration signal CAL_OPER and a count clock signal CNT_CLK.

The plurality of comparators CMP1 to CMP4 compares reference voltages VREFA and VREFB with conversion voltages V1 and V2 during an active period of the impedance calibration signal CAL_OPER, and outputs a comparison result.

The logic circuit XOR1 operates on the output of the comparator CMP1 and the output of the comparator CMP2, and outputs an operation result.

The logic circuit XOR2 operates on the output of the comparator CMP3 and the output of the comparator CMP4, and outputs an operation result.

The counter CNT1 increases or decreases code values of the first impedance control signals PCODE<0:N> according to the output of the logic circuit XOR1.

The counter CNT2 increases or decreases code values of the second impedance control signals NCODE<0:N> according to the output of the logic circuit XOR2.

The plurality of PMOS legs PMOS LEG1 and PMOS LEG2, and the NMOS leg NMOS LEG operate as digital-to-analog converters, respectively. That is, the plurality of PMOS legs PMOS LEG1 and PMOS LEG2, and the NMOS leg NMOS LEG convert the code values of the first impedance control signals PCODE<0:N> or the second impedance control signals NCODE<0:N> into the conversion voltages V1 and V2, respectively.

The impedance control signal generation unit 210 having the above-described configuration calibrates the code values of the first impedance control signals PCODE<0:N> such that the impedance of the PMOS legs PMO LEG1 is substantially identical to the impedance of the resistor RZQ outside the memory chip 100.

Furthermore, the impedance control signal generation unit 210 calibrates the code values of the second impedance control signals NCODE<0:N> such that the impedance of the NMOS legs NMOS LEG is substantially identical to the impedance of the PMOS legs PMO LEG2 receiving the first impedance control signals PCODE<0:N>.

Figure 5:
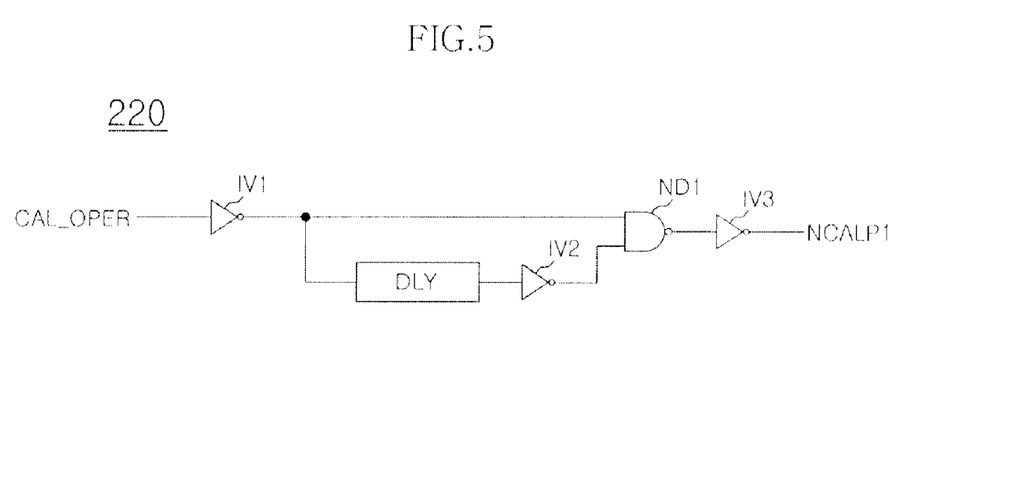
FIG. 5 is a circuit diagram of the timing control signal generation unit illustrated in FIG. 3.

As illustrated in FIG. 5, the timing control signal generation unit 220 of FIG. 3 generates the timing control signal NCALP1 maintaining an active state for the predetermined time from the active end time of the impedance calibration signal CAL_OPER.

The timing control signal generation unit 220 is a pulse generator and includes a plurality of inverters IV1 to IV3, a delay section DLY, and a NAND gate ND1.

Figure 6:
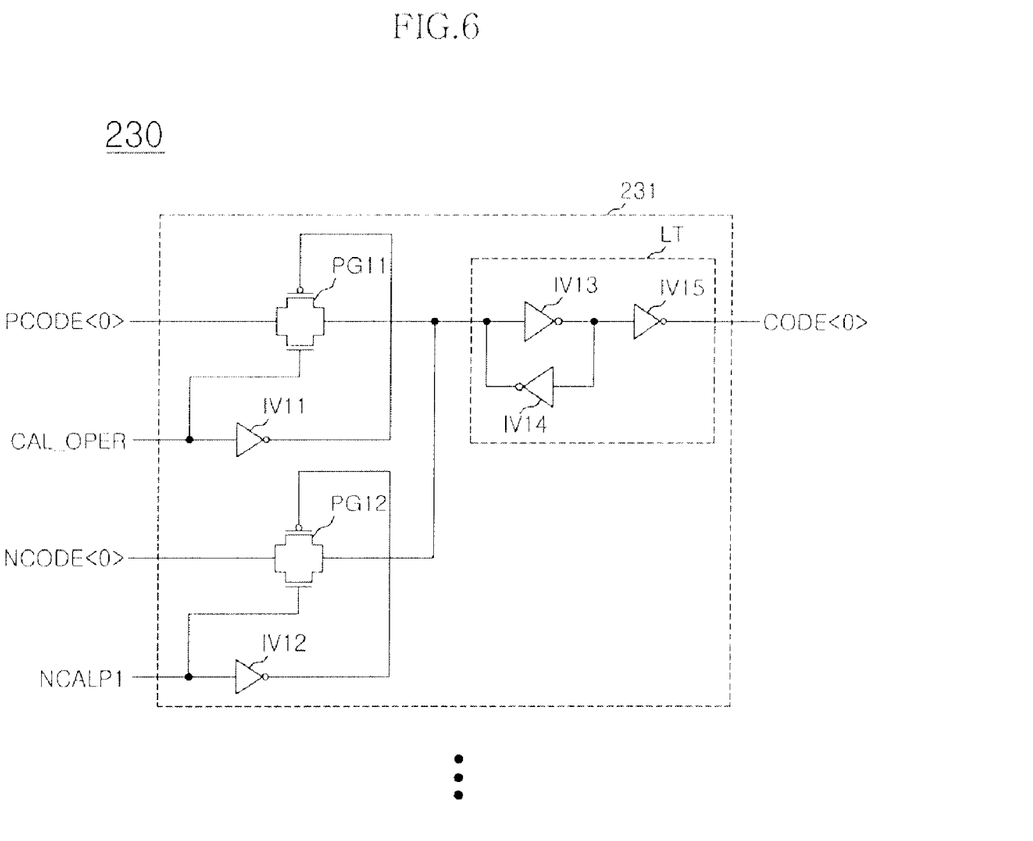
FIG. 6 is a circuit diagram of the multiplexing unit illustrated in FIG. 3.

As illustrated in FIG. 6, the multiplexing unit 230 of FIG. 3 outputs the first impedance control signals PCODE<0:N> as the multiplexed signals CODE<0:N> in response to the impedance calibration signal CAL_OPER, and outputs the second impedance control signals NCODE<0:N> as the multiplexed signals CODE<0:N> in response to the timing control signal NCALP1.

The multiplexing unit 230 includes a plurality of (N+1) multiplexing sections 231.

The multiplexing section 231 is configured to perform an operation for generating the above-described multiplexed signals CODE<0:N> according to respective bits of the first impedance control signals PCODE<0:N> and the second impedance control signals NCODE<0:N>.

The multiplexing section 231 includes a plurality of inverters IV11 and IV12, a plurality of pass gates PG11 and PG12, and a latch LT. The latch LT may include a plurality of inverters IV13 to IV15.

Figure 7:
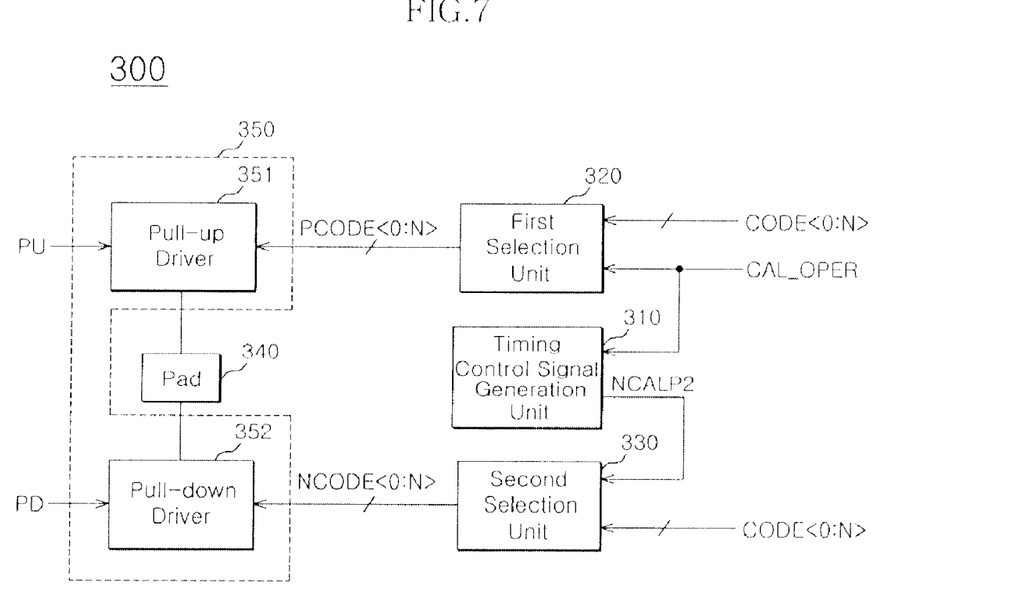
FIG. 7 is a block diagram illustrating the internal configuration of the input/output block illustrated in FIG. 2.

As illustrated in FIG. 7, the input/output block 300 of FIG. 2 includes a timing control signal generation unit 310, a first selection unit 320, a second selection unit 330, a pad 340, and a driver 350.

The timing control signal generation unit 310 is configured to generate a timing control signal NCALP2 in response to the impedance calibration signal CAL_OPER.

The timing control signal generation unit 310 generates the timing control signal NCALP2 maintaining an active state for a predetermined time from the active end time of the impedance calibration signal CAL_OPER.

The timing control signal generation unit 310 may have the same configuration as that of the timing control signal generation unit 220 illustrated in FIG. 5.

Accordingly, the timing control signal NCALP1 and the timing control signal NCALP2 have the substantially same timing.

The first selection unit 320 and the second selection unit 330 are configured to demultiplex the multiplexed signals CODE<0:N> according to time.

The first selection unit 320 is configured to select the multiplexed signals CODE<0:N> which are inputted during the active period of the impedance calibration signal CAL_OPER, and output the first impedance control signals PCODE<0:N>.

The second selection unit 330 is configured to select the multiplexed signals CODE<0:N> which are inputted during the active period of the timing control signal NCALP2, and output the second impedance control signals NCODE<0:N>.

The pad 340 may be a pad for data input/output.

The driver 350 is configured to drive the pad 340 at a data level based on impedance set according to the first impedance control signals PCODE<0:N> and the second impedance control signals NCODE<0:N>.

The driver 350 includes a pull-up driver 351 and a pull-down driver 352.

The impedance of the pull-up driver 351 is set according to the first impedance control signals PCODE<0:N>.

The impedance of the pull-down driver 352 is set according to the second impedance control signals NCODE<0:N>.

The pull-up driver 351 pulls the pad 340 up to a supply voltage level in response to a pull-up signal UP generated according to the data level.

The pull-down driver 352 pulls the pad 340 down to a ground voltage level in response to a pull-down signal PD generated according to the data level.

Figure 8:
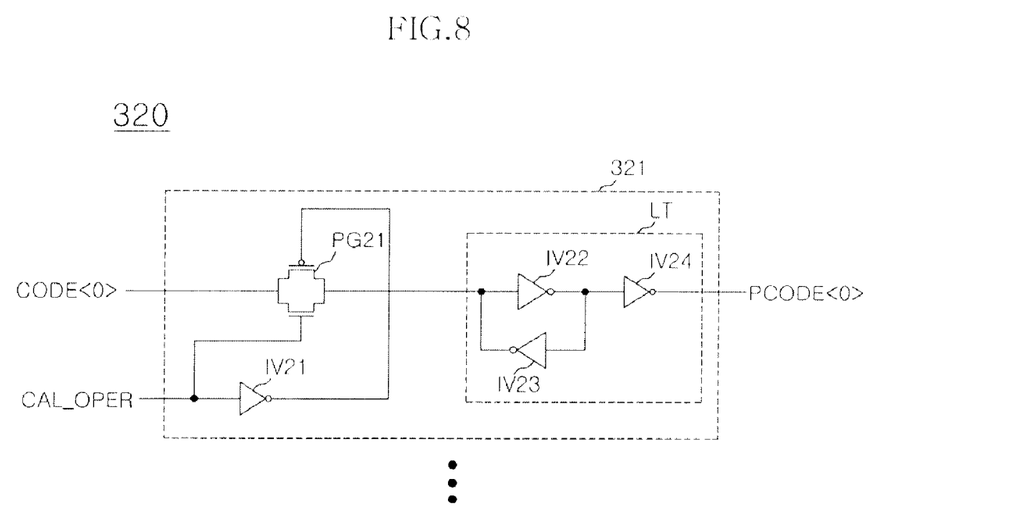
FIG. 8 is a circuit diagram of the first selection unit illustrated in FIG. 7.

As illustrated in FIG. 8, the first selection unit 320 of FIG. 7 is configured to select the multiplexed signals CODE<0:N> which are inputted during the active period of the impedance calibration signal CAL_OPER, and output the first impedance control signals PCODE<0: N>.

The first selection unit 320 includes a plurality of selection sections 321.

The selection section 321 is configured to perform an operation for selecting the above-described multiplexed signals CODE<0:N> for a corresponding bit of the multiplexed signals CODE<0:N>.

The second selection unit 330 may have the same configuration as that of the first selection unit 320 illustrated in FIG. 8, and receives the timing control signal NCALP2 instead of the impedance calibration signal CAL_OPER.

The selection section 321 includes an inverter IV21, a pass gate PG21, and a latch LT. The latch LT may include a plurality of inverters IV22 to IV24.

Figure 9:
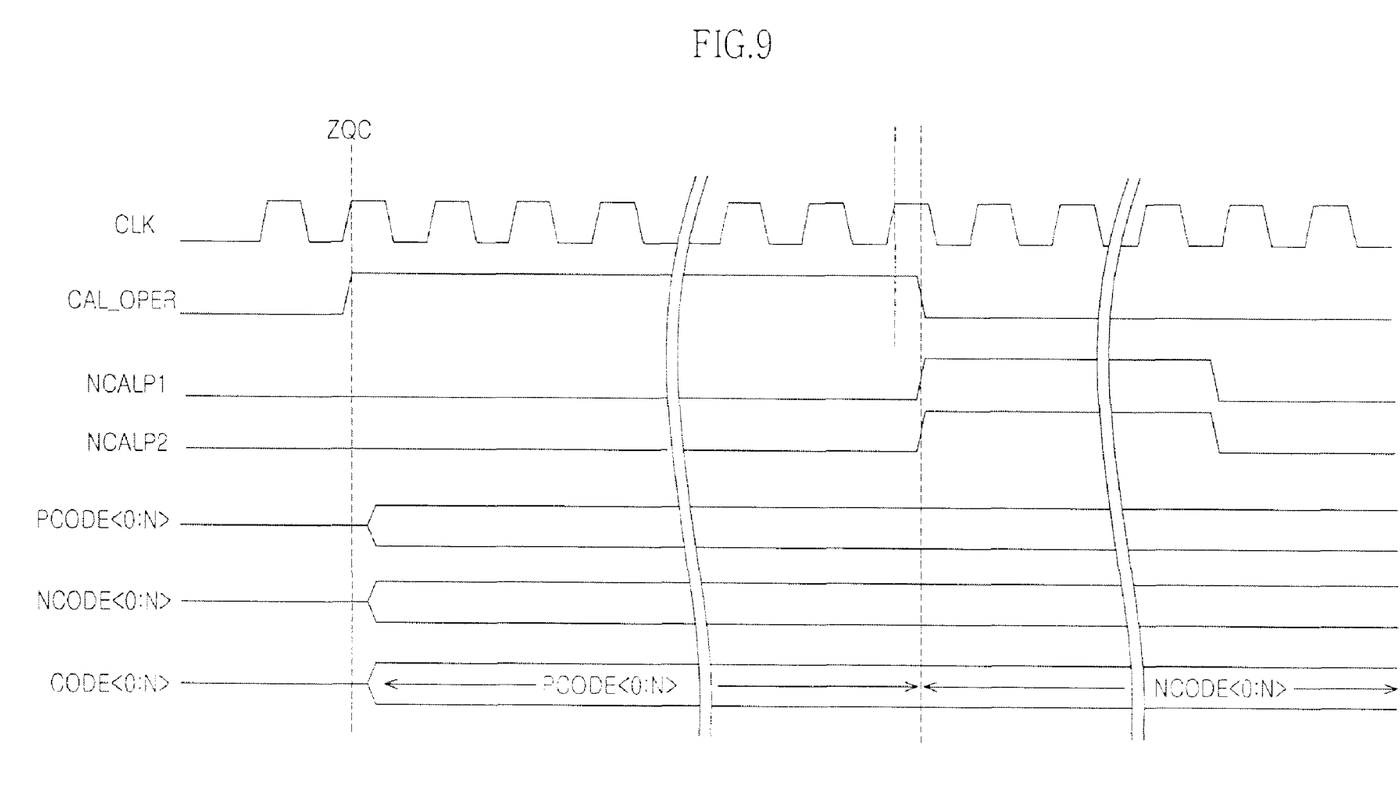
FIG. 9 is a diagram illustrating the operation timing of an impedance calibration circuit according to an embodiment of the present invention.

The operation of the above-described impedance calibration circuit according to the embodiment of the invention will be described below with reference to FIG. 9.

The impedance calibration signal CAL_OPER is generated according to the impedance calibration command ZQC.

A calibration operation of the first impedance control signals PCODE<0:N> and the second impedance control signals NCODE<0:N> is performed during the active period of the impedance calibration signal CAL_OPER.

The multiplexing unit 230 of the impedance control signal generation block 200 selects the first impedance control signals PCODE<0:N> during the active period of the impedance calibration signal CAL_OPER to generate the multiplexed signals CODE<0:N>.

The multiplexed signals CODE<0:N> are transmitted to the plurality of input/output blocks 300 through the global lines.

The first selection unit 320 of the input/output block 300 selects the multiplexed signals CODE<0:N> which are inputted during the active period of the impedance calibration signal CAL_OPER, and provides the multiplexed signals CODE<0:N> to the pull-up driver 351 as the first impedance control signals PCODE<0:N>.

The impedance of the pull-up driver 351 is set according to the first impedance control signals PCODE<0:N>.

Meanwhile, the timing control signals NCALP1 and NCALP2 are activated for the predetermined time from the active end time of the impedance calibration signal CAL_OPER.

The multiplexing unit 230 selects the second impedance control signals NCODE<0:N> during the active period of the timing control signal NCALP1 to generate the multiplexed signals CODE<0:N>.

The multiplexed signals CODE<0:N> are transmitted to the plurality of input/output blocks 300 through the global lines.

The second selection unit 330 selects the multiplexed signals CODE<0:N> which are inputted during the active period of the timing control signal NCALP2, and provides the multiplexed signals CODE<0:N> to the pull-down driver 352 as the second impedance control signals NCODE<0:N>.

The impedance of the pull-down driver 352 is set according to the second impedance control signals NCODE<0:N>.

The pull-up driver 351 and the pull-down driver 352 pull up and down the pad 340 based on the set impedance, respectively.

The semiconductor integrated circuit according to the embodiment of the invention transmits the impedance control signals at predetermined time intervals, thereby reducing the number of global lines for transmitting the impedance control signals to about half of the number of global lines according to the conventional art. Consequently, it is possible to increase the layout margin of a memory chip employing the impedance calibration circuit, or reduce the chip size.

While certain embodiments have been described above, it will be understood to those skilled in the art that the embodiments described are by way of example only. Accordingly, the semiconductor integrated circuit described herein should not be limited based on the described embodiments. Rather, the semiconductor integrated circuit described herein should only be limited in light of the claims that follow when taken in conjunction with the above description and accompanying drawings.

What is claimed is:

1. A semiconductor integrated circuit comprising:
   an impedance control signal generation block configured to transmit first impedance control signals and second impedance control signals through same signal lines at predetermined time intervals, the impedance control signal generation block comprising:
   an impedance control signal generation unit configured to generate the first impedance control signals and the second impedance control signals in response to an impedance calibration signal;
   a timing control signal generation unit configured to generate a timing control signal in response to the impedance calibration signal; and
   a multiplexing unit configured to generate multiplexed signals by multiplexing the first impedance control signals and the second impedance control signals according to the impedance calibration signal and the timing control signal; and
   input/output blocks configured to set impedance using the transmitted first impedance control signals and the second impedance control signals.

2. The semiconductor integrated circuit according to claim 1, wherein the transmitted first impedance control signals and the second impedance control signals are received separately at corresponding time intervals.

3. The semiconductor integrated circuit according to claim 1, wherein the input/output blocks are used to perform data input/output operation based on the set impedance.

4. The semiconductor integrated circuit according to claim 1, wherein the timing control signal generation unit is configured to generate the timing control signal maintaining an active state for a predetermined time from an active end time of the impedance calibration signal.

5. The semiconductor integrated circuit according to claim 1, wherein the multiplexing unit is configured to output the first impedance control signals as the multiplexed signals in response to the impedance calibration signal, and output the second impedance control signals as the multiplexed signals in response to the timing control signal.

6. The semiconductor integrated circuit according to claim 1, wherein the input/output block comprises:
   a pad;
   a timing control signal generation unit configured to generate a timing control signal in response to an impedance calibration signal;
   a first selection unit configured to output the first impedance control signals during an active period of the impedance calibration signal;
   a second selection unit configured to output the second impedance control signals during an active period of the timing control signal; and
   a driver configured to drive the pad based on impedance set according to the first impedance control signals and the second impedance control signals.

7. The semiconductor integrated circuit according to claim 6, wherein the timing control signal generation unit is configured to generate the timing control signal maintaining an active state for a predetermined time from an active end time of the impedance calibration signal.

* * * * *